(12) United States Patent
Gutta et al.

(10) Patent No.: US 10,461,770 B2
(45) Date of Patent: Oct. 29, 2019

(54) TECHNIQUES FOR CONFIGURABLE ADC FRONT-END RC FILTER

(71) Applicant: Analog Devices Global Unlimited Company, Hamilton (BM)

(72) Inventors: Avinash Gutta, Bangalore (IN); Venkata Aruna Srikanth Nittala, Bengaluru (IN)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/015,585

(22) Filed: Jun. 22, 2018

(65) Prior Publication Data
US 2019/0020352 A1 Jan. 17, 2019

Related U.S. Application Data

(60) Provisional application No. 62/532,178, filed on Jul. 13, 2017.

(51) Int. Cl.
*H03M 1/06* (2006.01)
*H03M 3/00* (2006.01)
*H03H 11/04* (2006.01)

(52) U.S. Cl.
CPC ............ *H03M 3/322* (2013.01); *H03H 11/04* (2013.01); *H03M 3/422* (2013.01)

(58) Field of Classification Search
CPC ........ H03M 1/22; H03M 3/422; H03M 3/322; H03H 1/02
USPC .................................. 341/155, 122.118, 120
See application file for complete search history.

(56) References Cited

U.S. PATENT DOCUMENTS

| 8,188,903 B2 * | 5/2012 | Yamaoka ................. H03K 4/08 341/155 |
| 9,564,916 B2 | 2/2017 | Bandyopadhyay |
| 2011/0169677 A1 * | 7/2011 | Dosho ................ H03H 11/1252 341/143 |
| 2012/0182168 A1 | 7/2012 | Shibata et al. |
| 2015/0192946 A1 * | 7/2015 | Kwon ....................... G05F 3/08 323/313 |

(Continued)

FOREIGN PATENT DOCUMENTS

WO 0036750 6/2000

OTHER PUBLICATIONS

"Taiwan Application Serial No. 107124237, Office Action dated May 10, 2019", w/o English Translation, 8 pgs.

(Continued)

*Primary Examiner* — Peguy Jean Pierre
(74) *Attorney, Agent, or Firm* — Schwegman Lundberg & Woessner, P.A.

(57) ABSTRACT

Techniques for a configurable analog-to-digital converter filter to ameliorate transfer function peaking or frequency response issues are provided. In an example, a front-end circuit of a processing circuit can include a resistor-capacitor filter including at least two capacitors and a switch circuit. The resistor-capacitor filter can couple an input analog signal to the processing circuit. The switch circuit can couple to a first capacitor of the at least two capacitors, and can selectively place a terminal of the first capacitor at a selected one of a plurality of distinct nodes of the resistor-capacitor filter to configure the circuit to address the peaking or frequency response issue.

23 Claims, 3 Drawing Sheets

(56) References Cited

U.S. PATENT DOCUMENTS

2015/0244385 A1\* 8/2015 Alladi ................ H03M 1/0629
 341/122
2016/0048707 A1 2/2016 Alladi et al.

OTHER PUBLICATIONS

Ku, Wayne, "The 80 percent focus that is often overlooked, SAR-ADC voltage reference circuit part III", Texas Instruments E2ETM Chinese Community, w/ English Translation, [Online] Retrieved from the internet on Jul. 18, 2019: <URL: https://e2echina.ti.com/question_answer/analog/data_converters/f/58/t/20411>, (Apr. 9, 2013), 7 pgs.

\* cited by examiner

TECHNIQUES FOR CONFIGURABLE ADC FRONT-END RC FILTER

PRIORITY AND RELATED APPLICATIONS

This patent application claims the benefit of priority of Gutta, U.S. Provisional Patent Application Ser. No. 62/532,178, entitled "TECHNIQUES FOR CONFIGURABLE ADC FRONT-END RC FILTER," filed on Jul. 13, 2017, which is hereby incorporated by reference herein in its entirety.

TECHNICAL FIELD

This document pertains generally, but not by way of limitation, to filters and, more particularly, to configurable filters for analog-to-digital converters (ADC).

BACKGROUND

An ADC can be defined, at least in part, by the following application requirements: its bandwidth (the range of frequencies of analog signals it can properly convert to a digital signal), its resolution (the number of discrete levels the maximum analog signal can be divided into and represented in the digital signal), and its signal to noise "SNR" ratio (how accurately the ADC can measure signal relative to the noise the ADC introduces). Analog-to-digital converters (ADCs) have many different designs, which can be chosen based on the application requirements. Signal transfer function peaking can be an issue with some designs of ADCs.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
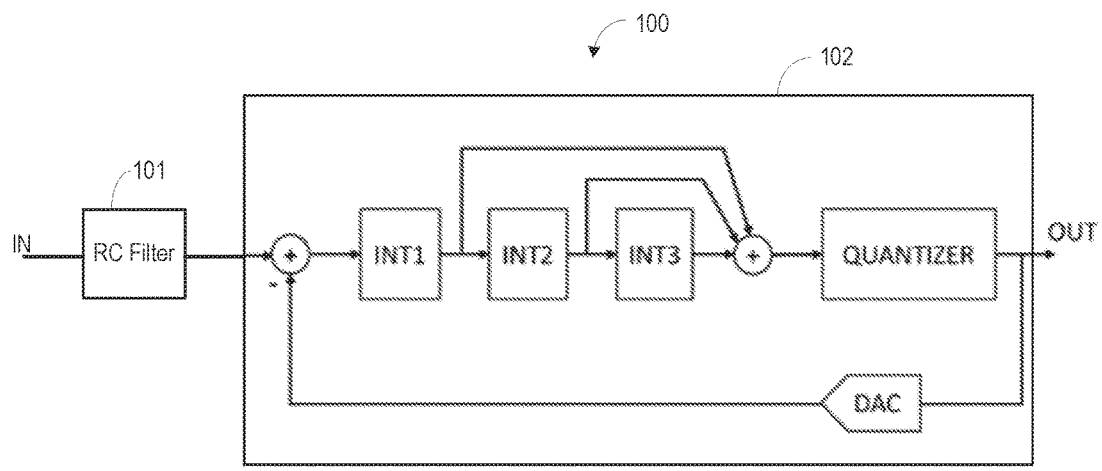
FIG. 1 illustrates generally an example system including an example configurable, resistor-capacitor (RC) front-end filter and an analog-to-digital converter.

Processing circuits such as analog-to-digital converters (ADCs) are electronic devices that can convert a continuous physical quantity carried by an analog input or signal to a digital number or output that represents the quantity's amplitude (or to a digital signal carrying that digital number). The conversion involves quantization of the analog input signal, so it would introduce a small amount of error. Typically the quantization occurs through periodic sampling of the analog input signal. The result is a sequence of digital values (i.e., a digital signal) that has convened a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise "SNR" ratio (how accurately the ADC can measure signal relative to the noise the ADC introduces). Analog-to-digital converters (ADCs) have many different designs, which can be chosen based on the application requirements.

Analog-to-digital converters (ADCs) based on delta-sigma (DS) modulation have been widely used in digital audio and high precision instrumentation systems. A delta-sigma ADC can include a loop filter, quantizer, and feedback digital-to-analog converter (DAC). A delta-sigma ADC can usually provide an advantage of being able to convert an analog input signal to a digital signal with high resolution at low cost. Typically, a delta-sigma ADC encodes an analog signal using a delta-sigma modulator or the quantizer. In certain examples, the quantizer can employ, for example, a low resolution ADC, such as a 1-bit ADC, Flash ADC, or Flash quantizer, etc. for encoding the analog signal. If applicable, the delta-sigma ADC can apply a digital filter to the output of the quantizer to form a higher-resolution digital output. The loop filter can include one or more integrators and may be included to provide error feedback for the delta-sigma ADC and to help shape the noise from the quantizer out of baseband to higher frequencies. The error is usually generated by taking the difference between the original analog input signal and a reconstructed version of the original analog input signal generated using the feedback DAC (where digitized signal is converted back into an analog signal). One key characteristic of a delta-sigma ADC is its ability to push the quantization noise, such as the noise from the quantizer 104) to higher frequencies. Pushing noise to different frequencies can also be referred to as noise shaping. The amount of noise shaping can depend on the order of the loop filter. delta-sigma ADCs are generally able to achieve high resolution analog-to-digital conversion.

Due to its popularity, many variations on the delta-sigma ADC and structures employing the delta-sigma ADC have been used and proposed. Depending on the application, different orders of the loop filter can be implemented. In some cases, the delta-sigma ADC can be implemented using continuous time circuitry (as opposed to discrete time circuitry). For example, the cascade of integrators can include discrete time integrators. In some cases, delta-sigma ADCs can be implemented with a mix of continuous time circuitry and discrete time circuitry for a hybrid architecture. For instance, some of the integrators (e.g., the first integrator in the cascade of integrators) can be implemented using continuous time circuitry while some other integrators (e.g., later integrator(s) in the cascade of integrators) can be implemented using discrete time circuitry. Generally speaking, a continuous-time, delta-sigma ADC or continuous-time circuitry can operate with lower power and achieve better wideband performance than its discrete time counterpart. Continuous-time, delta-sigma ADCs and discrete-time, delta-sigma ADC can also come in different flavors, e.g., feedback architecture and feedforward architecture. Different designs can affect the resulting signal transfer function and/or the noise transfer function of the delta-sigma ADC.

The ever increasing data rates in communication moves engineers to design analog-to-digital converters (ADCs) with higher Figures of Merit (FOM), e.g., greater requirements for bandwidth and accuracy, while being power efficient for prolonged battery life of the device having such ADCs. During the last couple of decades continuous-time, delta-sigma converters have been extensively used in high speed architectures due to the speed versus power advantages over its discrete-time counterpart (discrete-time, delta-sigma converters, having switch-capacitor circuits), and its inherent anti-aliasing capabilities.

FIG. 1 illustrates generally an example system 100 including an example configurable, resistor-capacitor (RC) front-end filter 101 and an analog-to-digital converter 102. In certain examples, the configurable RC front-end filter 101 can assist in ameliorating STF peaking of a continuous-time, feedforward, delta-sigma. ADC. In certain examples, the configurable RC front-end filter 101 can position a pole of the STF such that STF peaking is eliminated or reduced, in addition, the configurable RC front-end filter 101 can prevent the modulator or quantizer of the ADC 102 from overloading. Although not limited as such, the ADC 102 can be a continuous-time, delta-sigma ADC in a feedforward configuration. The illustrated ADC 102 is a third-order continuous-time, feedforward, delta-sigma ADC. In certain examples, the ADC 102 can have a single main feedback path from the output of the quantizer to the input of the first integrator INT1 and the outputs of the integrators INT1, INT2, and INT3 can be fed forward to the input of the quantizer (i.e., via three feedforward paths from respective outputs of the integrators to the adder in front of the quantizer). The quantizer can receive a summed signal having the outputs of the integrators (e.g., summed using an adder in front of the quantizer). Feedforward paths can ensure there is little to no signal content at the integrators subsequent to the first integrator, e.g., INT2, and INT3, and thus the subsequent integrators can be implemented and sized with lower power consumption in mind. As a result, continuous-time, feedforward, delta-sigma ADCs can be much more power efficient than continuous-time, feedback, delta-sigma. ADCs. Moreover, continuous-time, feedforward, delta-sigma ADCs converters have relaxed dynamic range requirements when compared to continuous-time, feedback, delta-sigma ADCs.

While the above examples are shown as being continuous-time, delta-sigma analog-to-digital converters, discrete-time, delta-sigma ADCs can also have feedback and feedforward architectures. For a feedback discrete-time, delta-sigma ADC, the ADC 102 can have feedback paths from the output of the quantizer to the inputs of the integrators. For a feedforward, discrete-time, delta-sigma ADC, the ADC 102 can have a single main feedback path from the output of the quantizer to the input of the first integrator INT1, and the outputs of the integrators INT1, INT2, and INT3 are fed forward to the input of the quantizer. The feedback and feedforward configurations are applicable to hybrid architectures where both continuous time and discrete time circuits are used for the delta-sigma ADC.

One of the drawbacks of the continuous-time, feedforward, ADCs is that the Signal Transfer function (STF) at higher frequencies can exhibit peaking. In a continuous-time, feedforward, delta-sigma converter, at high frequencies, the first integrator and the associated feedforward path overrules other contributors and ensures stability. Referring to FIG. 1, higher frequency signals can traverse the faster path through INT1 and the feedforward path from the output of INT1 to the input of the quantizer. When this occurs, the other integrators (e.g., INT2 and INT3) are no longer contributing, and the delta-sigma modulator can operate as a first order modulator. As a result, signal transfer function peaking can occur due to the open loop gain making a fast transition from an N-th order behavior to a first order behavior.

Due to signal transfer function (STF) peaking, continuous-time, feedforward, delta-sigma ADCs can amplify interferers or out of band blocking signals. In wireless applications where the presence of out of band blocking signals can cause the modulator to overload, STF peaking can be problematic. For this reason, designers working in these applications often revert back to using a less power efficient continuous-time, feedback, delta-sigma ADC instead of using a continuous-time, feedforward, delta-sigma ADC. Some designers use a brute force approach to address the interferers and out of band blocking signals by adding a low pass filter or similar in front of the converter to remove the undesirable signal components, but such brute force approach is not always ideal. Using a low pass filter is not a power efficient solution to deal with the undesirable signal components. These aforementioned issues are applicable to discrete-time, feedforward, delta-sigma ADCs as well, or even hybrid continuous-time, discrete-time, feedforward, delta-sigma ADCS having both continuous time and discrete time circuitry. In addition to the above issues, manufacturing anomalies can also effect the intended 3 db frequency of the ADC which can effect phase match between two ADCs and can lead to modulator instability.

The present inventors have recognized a more effective configurable RC front-end filter 101 that allows configuration to ameliorate STF peaking and allow for adjustment of the desired 3 db frequency. In certain examples, the configurable RC front-end filter 101 can position a pole of the STF such that STF peaking is eliminated or reduced. In addition, the configurable RC front-end filter 101 can prevent the modulator or quantizer of the ADC from overloading.

Figure 2:
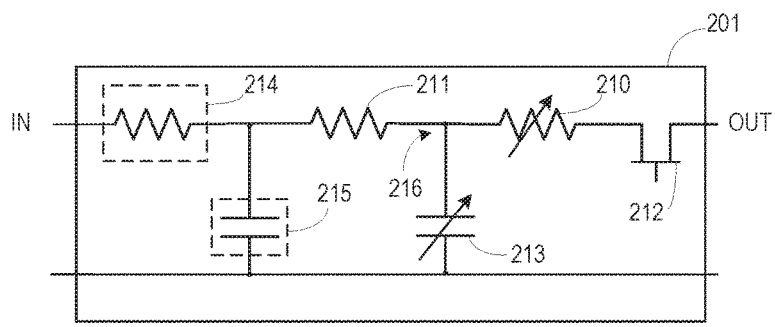
FIG. 2 illustrates generally an example configurable front-end RC filter for coupling a single-ended analog signal to an analog-to-digital-converter.

FIG. 2 illustrates generally an example configurable front-end RC filter 201 for coupling a single-ended analog signal (IN) to an ADC (not shown) such as a continuous-time, feedforward, delta-sigma ADC. The configurable front-end RC filter 201 can include two or more resistors 210, 211 or resistances coupled in series, an optional switch 212, and a capacitor 213. In certain examples, the series coupled resistors 210, 211 can receive the single-ended analog signal (IN) and in cooperation with the switch 212, couple the signal to an input of the ADC (not shown). The capacitor 213 can be coupled to an intermediate node 216 between two of the series coupled resistors 210, 211. In certain examples, the input stage of the ADC can include an operational amplifier and the signal input of the operation amplifier can provide a virtual ground. In certain examples, the resistor 210 nearest the output (OUT) of filter, or the input of the ADC, can be adjustable. In certain examples, adjustment of the resistor 210 nearest the input of the ADC can result in significant reduction of SFT peaking of the ADC. As an alternative, or in combination, adjustment of the capacitor 213 nearest the input of the ADC can also result in significant reduction of the SET peaking of the ADC. In certain examples, the configurable front-end RC filter 201 can optionally include additional series connected resistors 214 or additional capacitors 215.

Figure 3:
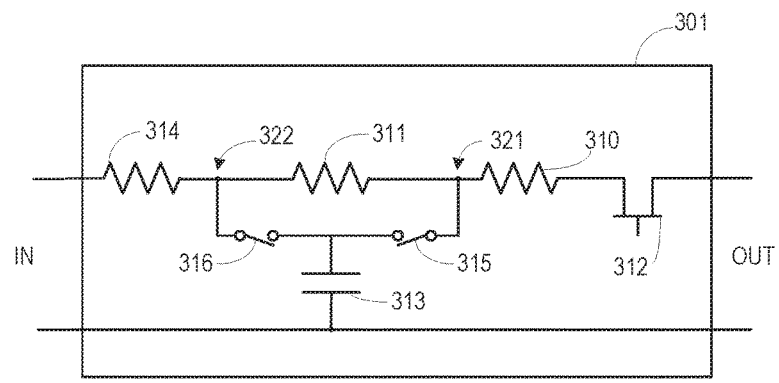
FIG. 3 illustrates generally an example configurable RC front-end filter for coupling a single-ended analog signal to an analog-to-digital-converter.

FIG. 3 illustrates generally an example configurable RC front-end filter 301 for coupling a single-ended analog signal (IN) to an ADC (not shown) such as a continuous-time, feedforward, delta-sigma ADC. The configurable front-end filter 301 can include two or more resistors 310, 311, 314 or resistances coupled in series, a plurality of switches 312, 316, 315, and a capacitor 313. In certain examples, the series coupled resistors 310, 311, 314 can receive the single-ended analog signal (IN) and in cooperation with a first switch 312, couple the signal to an input of the ADC, or the output of the configurable RC front-end filter 301. The capacitor 313 can have a first node coupled to a reference potential, such as ground, and a second node can be selectably coupled to an intermediate node of the series coupled resistors 310, 311, 314 via a second switch 315 or third switch 316. For example, for certain manufacturing anomalies, or when the ADC is operating at a first frequency, the capacitor 313 can be connected, via a second switch 315, to a first intermediate node 321 to reduce or eliminate SFT peaking associated with the manufacturing anomalies or first frequency. In some examples, the capacitor 313 can be coupled to a second intermediate node 322 to ameliorate SFT peaking associated with the manufacturing anomalies, or with the operation of the ADC at a second frequency. In certain examples, the first intermediate node 321 can be spatially located closer to the input of the ADC than the second intermediate node 322.

Figure 4:
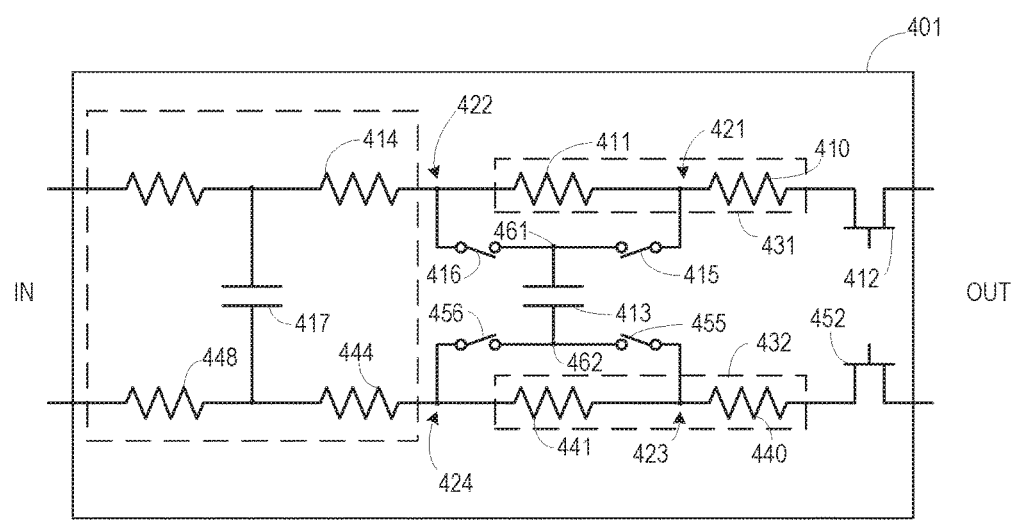
FIG. 4 illustrates generally an example configurable RC front-end filter for coupling a differential analog signal to an analog-to-digital-convener.

FIG. 4 illustrates generally an example configurable RC front-end filter 401 for coupling a differential analog signal (IN) to an ADC (not shown) such as a continuous-time, feedforward, delta-sigma ADC. The configurable RC front-end filter 401 can include parallel networks 431, 432 of two or more resistors 410, 411, 440, 441 or resistances coupled in series, a plurality of switches 415, 416, 455, 456, and a capacitor 413. In certain examples, the series coupled resistors networks 431, 432 can receive the differential analog signal (IN) and in cooperation with a first switch pair 412, 452, can couple the signal to an input of the ADC (not shown) via an output (OUT) of the configurable RC front-end filter 401. In some examples, the first switch pair 412, 452 can enable the configurable RC front-end filter 401 within a system, such as the system of FIG. 1 or FIG. 4 when the switch pair 412, 452 provides a low impedance connection to the input of the ADC and can disable the configurable RC front-end filter 401 when the switch pair 412, 452 provides a high impedance connection to, or isolates the resistors 410, 411, 440, 441 and capacitor 413 of the filter from, the input of the ADC.

In certain examples, each node 461, 462 of the capacitor 413 can be selectably coupled to an intermediate node 321, 322, 323, 324 of one of the networks 431, 432 of the series coupled resistances. In certain examples, for certain manufacturing anomalies, or when the ADC is operating a first frequency, the capacitor 413 can be connected, via a first switch 415 and a second switch 455, to a first pair of intermediate nodes 421, 423 to reduce or eliminate SFT peaking associated with the manufacturing anomalies or first frequency. In some examples, the capacitor 413 can be coupled to a second pair of intermediate nodes 422, 424 via a third switch 416 and a fourth switch 456 to ameliorate SFT peaking associated with the manufacturing anomalies, or with the operation of the ADC at a second frequency. In certain examples, the first pair of intermediate nodes 421, 423 can be located closer to the input of the ADC than the second pair of intermediate nodes 422, 424. In certain examples, the capacitor 413 can be spatially located closer to the output of the configurable RC front-end filter 401, or the input of the continuous-time, feedforward, delta-sigma ADC, to combat SFT peaking at lower frequencies and can be spatially located further from the input of the continuous-time, feedforward, delta-sigma ADC to combat SFT peaking at higher frequencies.

In certain examples, the configurable RC front-end filter 401 can optionally include additional resistances 414, 418, 444, 448 and a second capacitor 417. In some examples, the value of each resistance in each of the resistance networks 431, 432 can increase along with the distance the resistance, or resistor, is located from the output (OUT) of the configurable RC front-end filter 401. In some examples, spatial arrangement of the first capacitor 413 and the relative values of the resistances near the output (OUT) of the configurable RC front-end filter 401 can allow for programmability of the 3 db frequency of the configurable RC front-end filter 401.

Figure 5:
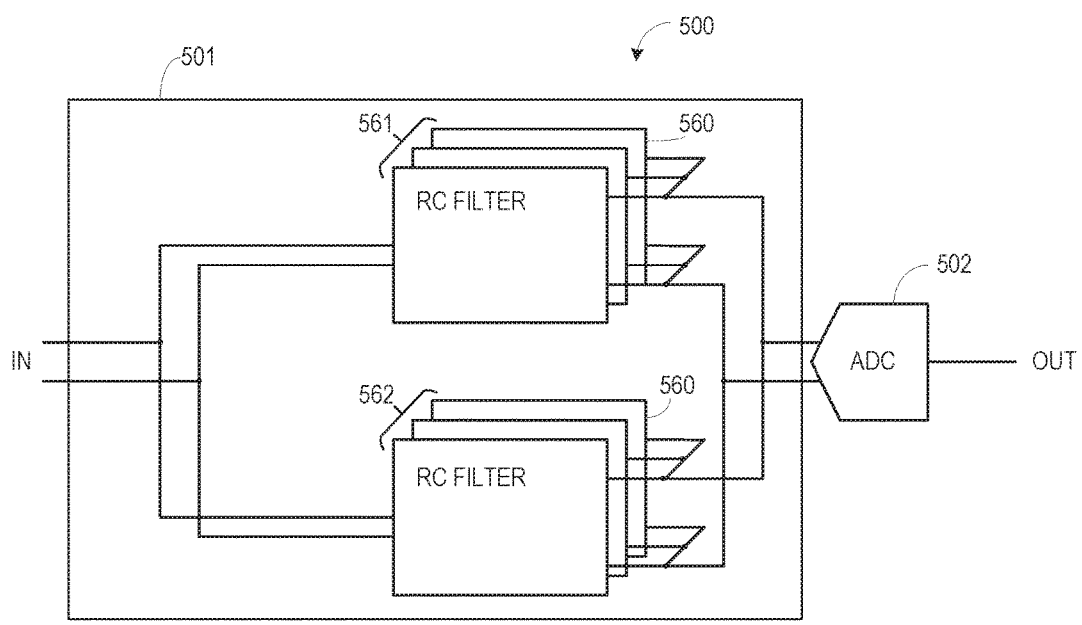
FIG. 5 illustrates generally a system including an example configurable RC filter and an analog-to-digital-converter.

FIG. 5 illustrates generally a system 500 including an example configurable RC filter 501 and an ADC 502. In certain examples, the configurable RC filter 501 can include a plurality of individual RC filters 560. In certain examples, each individual RC filter 560 of the plurality of individual RC filters can have the same architecture as each other individual RC filter. In certain examples, the architecture of any of the individual RC filters can include the architecture of any one of the examples of FIGS. 1-4. The plurality of individual RC filters 560 can allow for configuration by using one or more switches to couple (enable) or isolate (disable) an individual RC filter from an input of the ADC 502.

In certain examples, the plurality of individual RC filters 561 can be arranged into two or more groups of filters 561, 562. In an example, each individual RC filter 560 of the plurality of RC filters of each group 561, 562 can have a filter architecture such as the filter architecture shown in the example of FIG. 5. In some examples, each component of each individual RC filter 560 of each group 561, 562 can he the same as each corresponding component of each filter within the same group. In some examples, each group 561, 562 of individual RC filters can be configured for combating STF peaking for a detected set, or for a predetermined set, of manufacturing anomalies. In some examples, each group 561, 562 of individual RC filters can be configured for combating STF peaking for a particular operating frequency range of the ADC. In such examples, the switches used to spatially configure a capacitor of each RC filter 560 can be used to fine tune or provide increased tuning resolution of each group 561, 562 of RC filters of the configurable RC filter 501. In certain examples, a switch or switch pair of each individual RC filter 560 can allow each individual filter 560, or each group of filters 561, 562, to be enabled or disabled. In such an example, an ADC system 500 can include a controller (not shown) to control which group 561, 562 or set of individual RC filters 560 of the configurable RC filter 501 is enabled and disabled. In some examples, individual RC filters 560 can be enabled and disabled as a group or individually to allow for fine tuning of the configurable RC filter 501 to either the particular manufacturing anomalies of the ADC, to the particular operating mode or frequency of the ADC, or to a combination thereof.

It is understood that the configurable RC filter 501 can include more than two groups of individual RC filters without departing from the scope of the present subject matter. It is understood that each group of individual RC filters can include any number of individual RC filters without departing from the scope of the present subject matter. In certain examples, a first group of individual RC filters can include, for example, 32 RC filters having the resistances and capacitances design for a first 3 db frequency and a second group of individual RC filters can include, for example, 32 RC filters having the resistances and capacitances design for a second 3 db frequency, such that when a combination of the filters of the first group and filters of the second group are enabled, the filter can have a 3 db frequency that falls between the first 3 db frequency and the second 3 db frequency. In certain examples, a first group of individual RC filters can include a number of RC filters having the resistances and capacitances design for a first operating frequency of the ADC and a second group of individual RC filters can include a number of RC filters having the resistances and capacitances design for a second operating frequency of the ADC, such that when a combination of the filters of the first group and filters of the second group are enabled, the filter can ameliorate STF peaking at an operating frequency of the ADC falling between the first operating frequency and the second operating frequency that falls between the first 3 db frequency and the second 3 db frequency.

Figure 6:
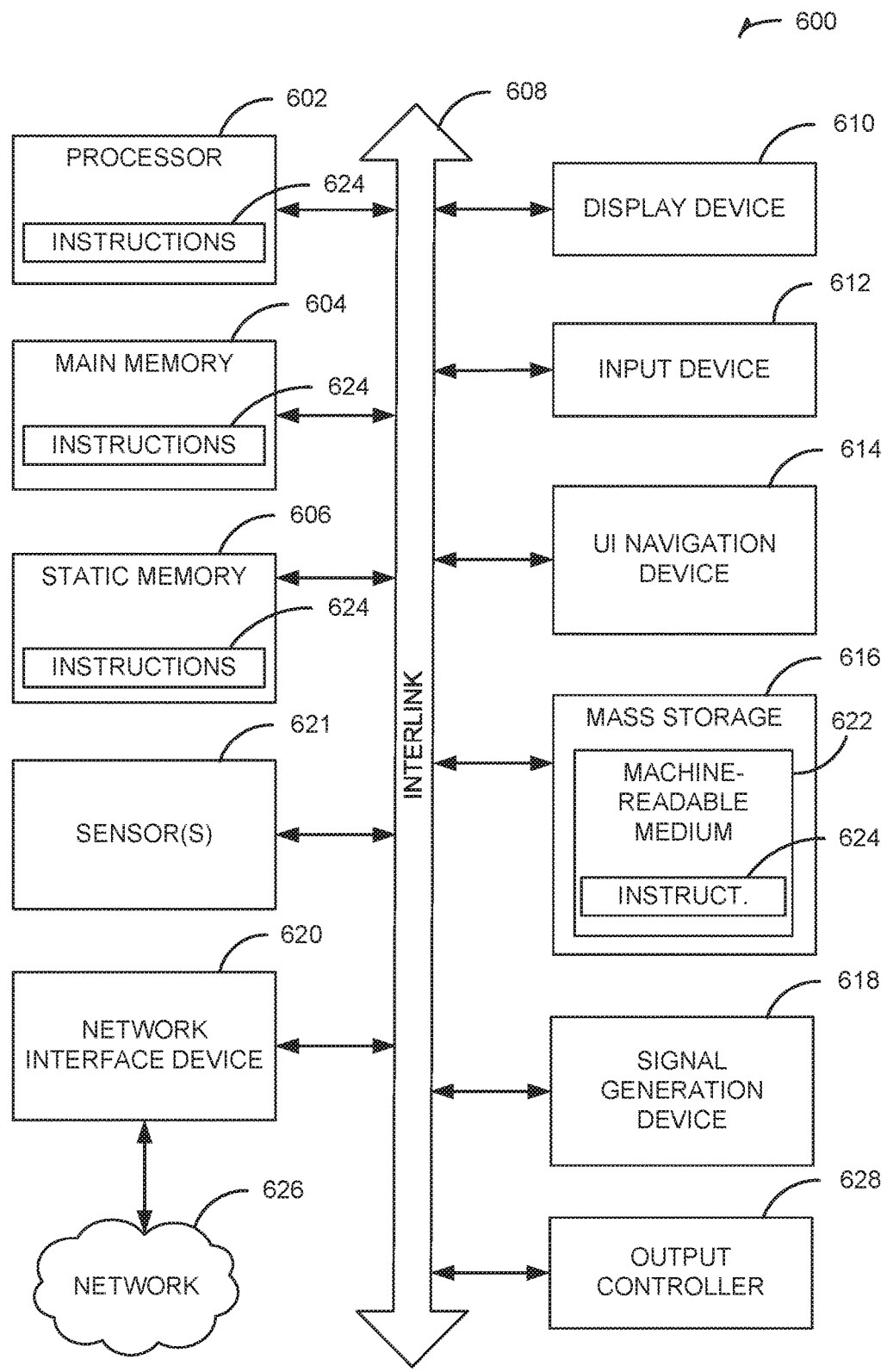
FIG. 6 illustrates a block diagram of an example machine, or controller, upon which any one or more of the techniques (e.g., methodologies) discussed herein may perform.

FIG. 6 illustrates a block diagram of an example machine 600, or controller, upon which any one or more of the techniques (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 600 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation.

Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse), sensors such as light or infrared sensors, gyroscopes, accelerometers and the associated filters and ADCs, such as those discussed above. In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 621, such as a global positioning system (GPS) sensor, compass, position sensor system such as a position sensor system as discussed above, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices a printer, card reader, etc.).

The storage device 616 may include a machine readable medium 622 on which is stored one or more sets of data structures or instructions 624 (e.g., software) embodying or utilized by any one or more of the techniques or functions described herein.

The instructions 624 may also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 may constitute machine readable media.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer networks, among others. In an example, the network interface device 620 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 CFR. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A front-end circuit for suppressing signal transfer function peaking of a processing circuit, the front-end circuit comprising:
   a resistor-capacitor filter including at least two capacitors, the resistor-capacitor filter configured to couple an input analog signal to the processing circuit;
   a switch circuit coupled to a first capacitor of the at least two capacitors, the switch circuit configured to selectively place a terminal of the first capacitor at a selected one of a plurality of distinct nodes of the resistor-capacitor filter; and
   wherein the resistor-capacitor filter comprises:
      a first set of series-connected resistances configured to couple a first differential input terminal with a first input of the processing circuit;, and
      a second set of series-connected resistances configured to couple a second differential input terminal with a second input of the processing circuit.

2. The circuit of claim 1, wherein the first and second differential input terminals of the resistor-capacitor filter are configured to receive the input analog signal.

3. The front-end circuit of claim 2, wherein the processing circuit includes an analog-to-digital converter (ADC).

4. The circuit of claim 3, wherein the at least two capacitors are configured to couple between nodes of the first set of series-connected resistances and the second set of series-connected resistances;
  wherein a second capacitor of the at least two capacitors is configured to couple between the first set of series-connected resistances and the second set of series-connected resistances at first nodes of sets of series-connected resistances, wherein the first nodes are located further along an electrical path of the resistor-capacitor filter from the first integrator than the selected one of the plurality of distinct nodes to which the first capacitor is selectively coupled; and
  wherein a first resistance of the first set of series-connected resistances is configured to couple between the terminal of the first capacitor and the first input of the first integrator; and
  wherein the first resistance has a lowest resistance value of the first set of series-connected resistances.

5. The circuit of claim 3, wherein a first resistance of the first set of series-connected resistances and a first resistance of the second set of series connected resistances are electrically coupled closer to the first integrator than the other resistances of the first set of series-connected resistances and the second set of series connected resistances; and
  wherein the first resistances are adjustable in resistance value to suppress signal transfer function peaking of the ADC.

6. The circuit of claim 3, wherein the switch circuit is configured to adjust states in response to a condition of the AI)C; and
  wherein the condition is a manufacturing anomaly of the ADC.

7. The circuit of claim 3, wherein the switch circuit is configured to adjust states in response to a condition of the ADC; and
  wherein the condition is a clock frequency of the ADC.

8. The circuit of claim 7, wherein the switch circuit, in a first state, is configured to couple the terminal of the first capacitor at a first distinct node of the plurality of distinct nodes when the condition of the ADC is lower than a first threshold value;
  wherein the switch circuit, in a second state, is configured to couple the terminal of the first capacitor at a second distinct node of the plurality of distinct nodes when the condition of the ADC is higher than the first threshold value
  wherein a first resistance of the resistor-capacitor filter is coupled between the first distinct node and the second distinct node,
  wherein the first distinct node is electrically coupled closer to the processing circuit than the second distinct node; and
  wherein a second resistance of the first set of series-connected resistances is electrically coupled between the first terminal of the first capacitor and a first terminal of the second capacitor when the switch circuit is in the second state.

9. A front-end circuit for suppressing signal transfer function peaking of an analog-to-digital converter (ADC), the circuit comprising:
  a plurality of resistor-capacitor (RC) filters selectively coupled in parallel with each other, the plurality of RC filters configured to couple an input analog signal with an integrator of the ADC; and
  wherein each resistor-capacitor filter includes at least two capacitors; and
  wherein a first capacitor of the at least two capacitors is electrically coupled closer to the integrator than a second capacitor of the at least two capacitors.

10. The front-end circuit of claim 9, wherein the plurality of RC filters are configured to receive a single-ended input analog signal.

11. The front-end circuit of claim 9, wherein the plurality of RC filters are configured to receive a differential input analog signal.

12. The front-end circuit of claim 9, wherein the plurality of RC filters include a first set of one or more RC filters and a second set of one or more RC filters; and
  wherein a first capacitor of each of the first set of one or more RC filters has less capacitance than the corresponding first capacitor of each of the second set of one or more RC filters.

13. The front-end circuit of claim 12, wherein each RC filter of the plurality of RC filters includes a switch circuit, the switch circuit configured to enable and disable a peak suppression effect of the corresponding RC filter.

14. The front-end circuit of claim 13, wherein the switch circuit of an individual one of the first set of one or more RC filters is configured to enable the peak suppression effect when an operating clock frequency of the ADC is above a first threshold value and to disable the peaking suppression effect when the operating clock frequency of the ADC is below a second threshold value; and
  wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value.

15. The front-end circuit of claim 13, wherein the switch circuit of an individual one of the first set of one or more RC filters is configured to enable the peaking suppression effect when an operating clock frequency of the ADC is above a first threshold value and to disable the peaking suppression effect when the operating clock frequency of the ADC is below a second threshold value; and
  wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value.

16. A system to enhance an analog-to-digital converter (ADC) transfer function by adjusting a front-end filter circuit, the system comprising:
  an ADC; and
  a configurable resistor-capacitor filter having at least two capacitors, the configurable resistor-capacitor filter configured to receive an analog input signal, to pass the analog input signal to a first integrator of the ADC, and to suppress signal transfer function peaking of the ADC.

17. The system of claim 16, wherein the ADC includes a feedforward ADC having a signal transfer function peak at an operating clock frequency of the feedforward ADC.

18. The system of claim 16, wherein the ADC includes a sigma-delta ADC having a signal transfer function peak at an operating clock frequency of the sigma-delta ADC.

19. The system of claim 16, wherein the ADC includes a feedforward, sigma-delta ADC having a signal transfer function peak at an operating clock frequency of the feedforward, sigma-delta ADC.

20. The system of claim 16, wherein the configurable resistor-capacitor filter includes differential input terminals, the differential input terminals configured to receive the analog input signal.

21. The front-end circuit of claim 1, wherein the switch circuit is further configured to selectively couple a first capacitor of the at least two capacitors with an intermediate node of the first set of series-connected resistances.

22. The front-end circuit of claim 9, wherein at least one RC filter of the plurality of RC filters includes:
   a set of series-connected resistances configured to couple the input analog signal with an integrator of the ADC; and
   a switch circuit configured to selectively couple the first capacitor with an intermediate node of the set of series-connected resistances.

23. The system of claim 16, wherein the configurable resistor-capacitor filter includes:
   a set of series-connected resistances configured to couple the input analog signal with an input of the ADC; and
   a switch circuit configured to selectively couple the first capacitor with an intermediate node of the set of series-connected resistances.

\* \* \* \* \*

UNITED STATES PATENT AND TRADEMARK OFFICE
CERTIFICATE OF CORRECTION

PATENT NO. : 10,461,770 B2  
APPLICATION NO. : 16/015585  
DATED : October 29, 2019  
INVENTOR(S) : Gutta et al.

Page 1 of 4

It is certified that error appears in the above-identified patent and that said Letters Patent is hereby corrected as shown below:

In the Claims

In Column 10, Line 59, in Claim 1, delete "circuit;," and insert --circuit;-- therefor In Column 10, Line 63, in Claim 2, before "circuit", insert --front-end--

In Column 11, Line 1, in Claim 4, before "circuit", insert --front-end--

In Column 11, Line 20, in Claim 5, before "circuit", insert --front-end--

In Column 11, Line 29, in Claim 6, before "circuit", insert --front-end--

In Column 11, Line 31, in Claim 6, delete "AI)C;" and insert --ADC;-- therefor

In Column 11, Line 34, in Claim 7, before "circuit", insert --front-end--

In Column 11, Line 38, in Claim 8, before "circuit", insert --front-end--

In Column 11, Line 47, in Claim 8, after "value", insert --;--

In Columns 11-12, in Claim 9, delete "9. A front-end circuit for suppressing signal transfer function peaking of an analog-to-digital converter (ADC), the circuit comprising: a plurality of resistor-capacitor (RC) filters selectively coupled in parallel with each other, the plurality of RC filters configured to couple an input analog signal with an integrator of the ADC; and
wherein each resistor-capacitor filter includes at least two capacitors; and
wherein a first capacitor of the at least two capacitors is electrically coupled closer to the integrator than a second capacitor of the at least two capacitors." and insert --9. The front-end circuit of claim 1, wherein the switch circuit is further configured to selectively couple a first Signed and Sealed this  
Eighth Day of December, 2020

Andrei Iancu  
*Director of the United States Patent and Trademark Office*

CERTIFICATE OF CORRECTION (continued)

U.S. Pat. No. 10,461,770 B2 capacitor of the at least two capacitors with an intermediate node of the first set of series-connected resistances.-- therefor In Column 12, Lines 4-6, in Claim 10, delete "10. The front-end circuit of claim 9, wherein the plurality of RC filters are configured to receive a single-ended input analog signal." and insert
--10. A front-end circuit for suppressing signal transfer function peaking of an analog-to-digital converter (ADC), the circuit comprising:
a plurality of resistor-capacitor (RC) filters selectively coupled in parallel with each other, the plurality of RC filters configured to couple an input analog signal with an integrator of the ADC; and
wherein each resistor-capacitor filter includes at least two capacitors; and
wherein a first capacitor of the at least two capacitors is electrically coupled closer to the integrator than a second capacitor of the at least two capacitors.-- therefor In Column 12, Lines 7-9, in Claim 11, delete "11. The front-end circuit of claim 9, wherein the plurality of RC filters are configured to receive a differential input analog signal." and insert --11. The front-end circuit of claim 10, wherein the plurality of RC filters are configured to receive a single-ended input analog signal.-- therefor In Column 12, Lines 10-17, in Claim 12, delete "12. The front-end circuit of claim 9, wherein the plurality of RC filters include a first set of one or more RC filters and a second set of one or more RC filters; and
wherein a first capacitor of each of the first set of one or more RC filters has less capacitance than the corresponding first capacitor of each of the second set of one or more RC filters." and insert --12. The front-end circuit of claim 10, wherein the plurality of RC filters are configured to receive a differential input analog signal.-- therefor In Column 12, Lines 18-21, in Claim 13, delete "13. The front-end circuit of claim 12, wherein each RC filter of the plurality of RC filters includes a switch circuit, the switch circuit configured to enable and disable a peak suppression effect of the corresponding RC filter." and insert --13. The front-end circuit of claim 10, wherein the plurality of RC filters include a first set of one or more RC filters and a second set of one or more RC filters; and
wherein a first capacitor of each of the first set of one or more RC filters has less capacitance than the corresponding first capacitor of each of the second set of one or more RC filters.-- therefor In Column 12, Lines 22-36, in Claim 14, delete "14. The front-end circuit of claim 13, wherein the switch circuit of an individual one of the first set of one or more RC filters is configured to enable the peak suppression effect when an operating clock frequency of the ADC is above a first threshold value and to disable the peaking suppression effect when the operating clock frequency of the ADC is below a second threshold value; and
wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value." and insert --14. The front-end circuit of claim 13, wherein each RC filter of the plurality of RC filters includes a switch

CERTIFICATE OF CORRECTION (continued)
U.S. Pat. No. 10,461,770 B2 circuit, the switch circuit configured to enable and disable a peak suppression effect of the corresponding RC filter.-- therefor In Column 12, Lines 37-50, in Claim 15, delete "15. The front-end circuit of claim 13, wherein the switch circuit of an individual one of the first set of one or more RC filters is configured to enable the peaking suppression effect when an operating clock frequency of the ADC is above a first threshold value and to disable the peaking suppression effect when the operating clock frequency of the ADC is below a second threshold value; and
wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value." and insert --15. The front-end circuit of claim 14, wherein the switch circuit of an individual one of the first set of one or more RC filters is configured to enable the peak suppression effect when an operating clock frequency of the ADC is above a first threshold value and to disable the peaking suppression effect when the operating clock frequency of the ADC is below a second threshold value; and
wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value.-- therefor In Column 12, Lines 51-61, in Claim 16, delete "16. A system to enhance an analog-to-digital converter (ADC) transfer function by adjusting a front-end filter circuit, the system comprising:
an ADC; and
a configurable resistor-capacitor filter having at least two capacitors, the configurable resistor-capacitor filter configured to receive an analog input signal, to pass the analog input signal to a first integrator of the ADC, and to suppress signal transfer function peaking of the ADC." and insert --16. The front-end circuit of claim 14, wherein the switch circuit of an individual one of the first set of one or more RC filters is configured to enable the peaking suppression effect when an operating clock frequency of the ADC is above a first threshold value and to disable the peaking suppression effect when the operating clock frequency of the ADC is below a second threshold value; and
wherein the switch circuit of an individual one of the second set of one or more RC filters is configured to enable the peaking suppression effect when the operating clock frequency of the ADC is below the second threshold value and to disable the peaking suppression effect when the operating clock frequency of the ADC is above the first threshold value.-- therefor In Column 12, Lines 62-64, in Claim 17, delete "17. The system of claim 16, wherein the ADC includes a feedforward ADC having a signal transfer function peak at an operating clock frequency of the feedforward ADC." and insert --17. The front-end circuit of claim 10, wherein at least one RC filter of the plurality of RC filters includes:
a set of series-connected resistances configured to couple the input analog signal with an integrator of the ADC; and
a switch circuit configured to selectively couple the first capacitor with an intermediate node of the set of series-connected resistances.-- therefor

CERTIFICATE OF CORRECTION (continued)
U.S. Pat. No. 10,461,770 B2

In Column 12, Lines 65-67, in Claim 18, delete "18. The system of claim 16, wherein the ADC includes a sigma-delta ADC having a signal transfer function peak at an operating clock frequency of the sigma-delta ADC." and insert --18. A system to enhance an analog-to-digital converter (ADC) transfer function by adjusting a front-end filter circuit, the system comprising:
an ADC; and
a configurable resistor-capacitor filter having at least two capacitors, the configurable resistor-capacitor filter configured to receive an analog input signal, to pass the analog input signal to a first integrator of the ADC, and to suppress signal transfer function peaking of the ADC.-- therefor In Column 13, Lines 1-4, in Claim 19, delete "19. The system of claim 16, wherein the ADC includes a feedforward, sigma-delta ADC having a signal transfer function peak at an operating clock frequency of the feedforward, sigma-delta ADC." and insert --19. The system of claim 18, wherein the ADC includes a feedforward ADC having a signal transfer function peak at an operating clock frequency of the feedforward ADC.-- therefor In Column 13, Lines 5-8, in Claim 20, delete "20. The system of claim 16, wherein the configurable resistor-capacitor filter includes differential input terminals, the differential input terminals configured to receive the analog input signal." and insert --20. The system of claim 18, wherein the ADC includes a sigma-delta ADC having a signal transfer function peak at an operating clock frequency of the sigma-delta ADC.-- therefor In Column 13, Lines 9-12, in Claim 21, delete "21. The front-end circuit of claim 1, wherein the switch circuit is further configured to selectively couple a first capacitor of the at least two capacitors with an intermediate node of the first set of series-connected resistances." and insert --21. The system of claim 18, wherein the ADC includes a feedforward, sigma-delta ADC having a signal transfer function peak at an operating clock frequency of the feedforward, sigma-delta ADC.-- therefor In Column 13, Lines 13-20, in Claim 22, delete "22. The front-end circuit of claim 9, wherein at least one RC filter of the plurality of RC filters includes:
a set of series-connected resistances configured to couple the input analog signal with an integrator of the ADC; and
a switch circuit configured to selectively couple the first capacitor with an intermediate node of the set of series-connected resistances." and insert --22. The system of claim 18, wherein the configurable resistor-capacitor filter includes differential input terminals, the differential input terminals configured to receive the analog input signal.-- therefor In Column 13, Lines 21, in Claim 23, delete "16," and insert --18,-- therefor